(12) United States Patent
Chang Chien et al.

(10) Patent No.: US 10,515,936 B1
(45) Date of Patent: Dec. 24, 2019

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/016,672

(22) Filed: Jun. 25, 2018

(51) Int. Cl.
*H01L 23/48* (2006.01)
*H01L 23/52* (2006.01)
(Continued)

(52) U.S. Cl.
CPC .......... *H01L 25/105* (2013.01); *H01L 21/568* (2013.01); *H01L 21/6835* (2013.01); *H01L 23/3114* (2013.01); *H01L 23/3135* (2013.01); *H01L 24/06* (2013.01); *H01L 24/11* (2013.01); *H01L 24/13* (2013.01); *H01L 24/19* (2013.01); *H01L 24/20* (2013.01); *H01L 24/96* (2013.01); *H01L 21/31058* (2013.01); *H01L 25/16* (2013.01); *H01L 2224/0231* (2013.01); *H01L 2224/02379* (2013.01); *H01L 2224/0401* (2013.01); *H01L 2224/11003* (2013.01);
(Continued)

(58) Field of Classification Search
CPC ..... H01L 25/105; H01L 21/568; H01L 24/96; H01L 24/19; H01L 24/11; H01L 24/20; H01L 21/6835; H01L 23/3135; H01L 23/3114; H01L 24/13; H01L 24/06; H01L 2225/1035; H01L 2225/1058; H01L 2224/11849; H01L 2224/0231; H01L 2224/11003; H01L 2224/13022; H01L 21/31058; H01L 2224/02379; H01L 25/16; H01L 2924/19105; H01L 2224/24195; H01L 2224/24145; H01L 2224/2518; H01L 2224/211; H01L 2224/16145; H01L 2224/0401; H01L 2224/11334

See application file for complete search history.

(56) References Cited

U.S. PATENT DOCUMENTS 8,884,422 B2 * 11/2014 Goh .................. H01L 25/16
257/686
8,916,481 B2 12/2014 Gan et al.
(Continued)

*Primary Examiner* — Ismail A Muse
(74) *Attorney, Agent, or Firm* — JCIPRNET

(57) ABSTRACT

A package structure includes a first redistribution structure, a die, a plurality of conductive sheets, a plurality of conductive balls, and a first encapsulant. The first redistribution structure has a first surface and a second surface opposite to the first surface. The die has a plurality of connection pads electrically connected to the first surface of the first redistribution structure. The conductive sheets are electrically connected to the first surface of the first redistribution structure. The conductive balls are correspondingly disposed on the conductive sheets and are electrically coupled to the first surface of the first redistribution structure through the conductive sheets. The first encapsulant encapsulates the die, the conductive sheets, and the conductive balls. The first encapsulant exposes at least a portion of each conductive ball.

8 Claims, 20 Drawing Sheets

(51) Int. Cl.
*H01L 29/40* (2006.01)
*H01L 25/10* (2006.01)
*H01L 23/00* (2006.01)
*H01L 23/31* (2006.01)
*H01L 21/683* (2006.01)
*H01L 21/56* (2006.01)
*H01L 25/16* (2006.01)
*H01L 21/3105* (2006.01)

(52) U.S. Cl.
CPC ........... *H01L 2224/11334* (2013.01); *H01L 2224/11849* (2013.01); *H01L 2224/13022* (2013.01); *H01L 2224/16145* (2013.01); *H01L 2224/211* (2013.01); *H01L 2224/24145* (2013.01); *H01L 2224/24195* (2013.01); *H01L 2224/2518* (2013.01); *H01L 2225/1035* (2013.01); *H01L 2225/1058* (2013.01); *H01L 2924/19105* (2013.01)

(56) References Cited

U.S. PATENT DOCUMENTS

| | | | |
|---|---|---|---|
| 8,928,134 B2 | 1/2015 | Huang et al. | |
| 9,064,781 B2 | 6/2015 | Zhao et al. | |
| 9,691,707 B2 | 6/2017 | Chi et al. | |
| 2007/0290376 A1* | 12/2007 | Zhao | H01L 21/56 257/787 |
| 2009/0146301 A1* | 6/2009 | Shimizu | B29C 43/18 257/738 |
| 2009/0261466 A1* | 10/2009 | Pagaila | H01L 21/6835 257/686 |
| 2010/0244216 A1* | 9/2010 | Huang | H01L 21/561 257/686 |
| 2011/0156264 A1* | 6/2011 | Machida | H01L 21/4846 257/773 |
| 2014/0210106 A1 | 7/2014 | Zhai | |
| 2019/0019758 A1* | 1/2019 | Kim | H01L 23/5389 |

\* cited by examiner

PACKAGE STRUCTURE AND MANUFACTURING METHOD THEREOF

BACKGROUND OF THE INVENTION

1. Field of the Invention

The disclosure generally relates to a package structure and a manufacturing method thereof, and in particular, to a package structure having conductive sheets and a manufacturing method thereof.

2. Description of Related Art

Electronic products that are lighter, slimmer, shorter, and smaller than their previous generation counterparts are highly sought on the market. Therefore, extensive research is performed to find new technologies for semiconductor packaging that help to reduce the volume and the weight of existing devices. 3D stacking technologies such as package-on-package have been developed to meet the requirements of higher packaging densities.

SUMMARY OF THE INVENTION

The disclosure provides a package structure and a manufacturing method thereof, which is able to vertically integrate various devices with lower manufacturing costs and higher process flexibility.

The disclosure provides a package including a first redistribution structure, a die, a plurality of conductive sheets, a plurality of conductive balls, and a first encapsulant. The first redistribution structure has a first surface and a second surface opposite to the first surface. The die has a plurality of connection pads electrically connected to the first surface of the first redistribution structure. The conductive sheets are electrically connected to the first surface of the first redistribution structure. The conductive balls are correspondingly disposed on the conductive sheets and are electrically coupled to the first surface of the first redistribution structure through the conductive sheets. The first encapsulant encapsulates the die, the conductive sheets, and the conductive balls. The first encapsulant exposes at least a portion of each conductive ball.

The disclosure provides a manufacturing method of a package structure. The method includes at least the following steps. A carrier having an adhesive layer thereon is provided. A plurality of conductive sheets are formed on the adhesive layer. A plurality of conductive balls are formed on the conductive sheets. A plurality of dies are placed on the adhesive layer. Each die has a plurality of connection pads. The connection pads are embedded within the adhesive layer. A first encapsulant is formed to encapsulate the dies, the conductive sheets, and the conductive balls. The first encapsulant exposes at least a portion of each conductive ball. The adhesive layer is separated from the dies, the conductive sheets, and the first encapsulant. A first redistribution structure is formed over the dies, the conductive sheets and the first encapsulant. The first redistribution structure is electrically connected to the dies and the conductive sheets.

Based on the above, the package structure is formed with a fan-out design suitable for dual-side vertical integration. For example, vertical electrical connection within the package structure is provided by the conductive balls and the conductive sheets embedded in the first encapsulant. Since the conductive balls and the conductive sheets may be formed by rather simple and cheap processes, the processing complexity and the manufacturing cost of the package structure may be significantly reduced. Moreover, the adaption of conductive balls and the conductive sheets also eliminates the conventional wet chemical processes for forming the vertical conductive structures. Due to lower chemical resistance concerns, higher flexibility in selecting the material for the die bonding adhesive may be achieved.

To make the aforementioned more comprehensible, several embodiments accompanied with drawings are described in detail as follows.

BRIEF DESCRIPTION OF THE DRAWINGS

The accompanying drawings are included to provide further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
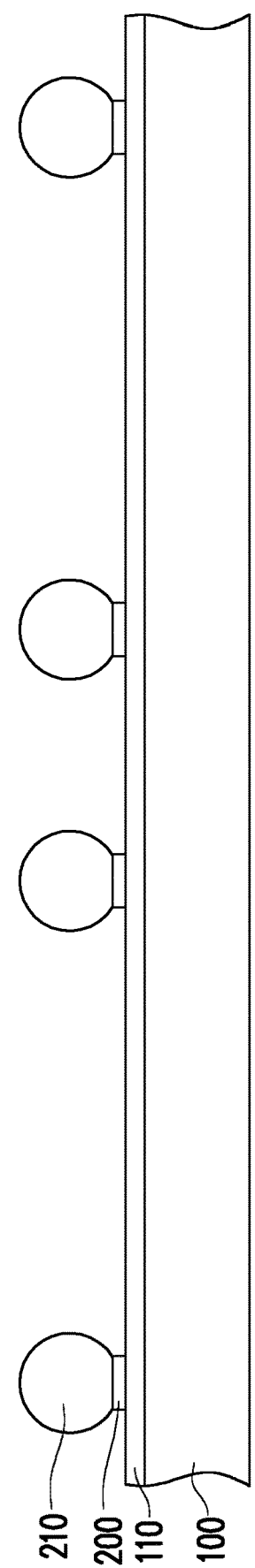
FIG. 1A to FIG. 1I are schematic cross-sectional views illustrating a manufacturing method of a package structure according to some embodiments of the disclosure.

Reference will now be made in detail to some embodiments of the present disclosure, examples of which are illustrated in the accompanying drawings. Wherever possible, the same reference numbers are used in the drawings and the description to refer to the same or like parts.

FIG. 1A to FIG. 1I are schematic cross-sectional views illustrating a manufacturing method of a package structure 10 according to some embodiments of the disclosure. Referring to FIG. 1A, a first carrier 100 having a first adhesive layer 110 provided thereon is provided. The first carrier 100 may be a glass substrate or a glass supporting board. However, they construe no limitation in the disclosure. Other suitable substrate material may be adapted as the first carrier 100 as long the material is able to withstand the subsequent processes while carrying the package structure formed thereon. The first adhesive layer 110 may be formed on the first carrier 100 to enhance the adhesion between the first carrier 100 and other structures subsequently formed thereon. The first adhesive layer 110 may include a light to heat conversion (LTHC) adhesive layer, epoxy resins, inorganic materials, organic polymeric materials, or other suitable adhesive materials. However, the disclosure is not limited thereto, and other suitable adhesive layers may be used in some alternative embodiments.

As illustrated in FIG. 1A, a plurality of conductive sheets 200 and a plurality of conductive balls 210 are sequentially formed on the first adhesive layer 110. In some embodiments, the conductive sheets 200 may be formed by placing pre-fabricated copper layers on a corresponding area of the first adhesive layer 110. In some alternative embodiments, the conductive sheets 200 may be formed by depositing a conductive material layer (not shown) over the first adhesive layer 110. A photolithography and an etching process are performed to pattern the conductive material layer, thereby obtaining a plurality of conductive sheets 200 on the first adhesive layer 110. In some embodiments, a material of the conductive sheets 200 may include copper, but the disclosure is not limited thereto. In some other embodiments, conductive materials capable of joining with other conductive materials may also be adapted as the material of the conductive sheets 200. The conductive balls 210 are disposed on the corresponding conductive sheets 200. The conductive balls 210 may be formed through the following method. Each conductive ball 210 may be disposed on the corresponding conductive sheet 200 by a pick-and-place process or a ball placement process. Thereafter, a high temperature reflow process may be performed on the conductive balls 210 and the conductive sheets 200 to form an intermetallic layer (not shown) between each conductive sheet 200 and each conductive ball 210, thereby physically coupling the conductive sheets 200 and the conductive balls 210. In some embodiments, the conductive balls 210 include solder balls. However, the disclosure is not limited thereto. In some other embodiments, conductive balls 210 may be made of other conductive materials as long as the conductive balls are able to form a steady joint with the conductive sheets 200.

Figure 1B:
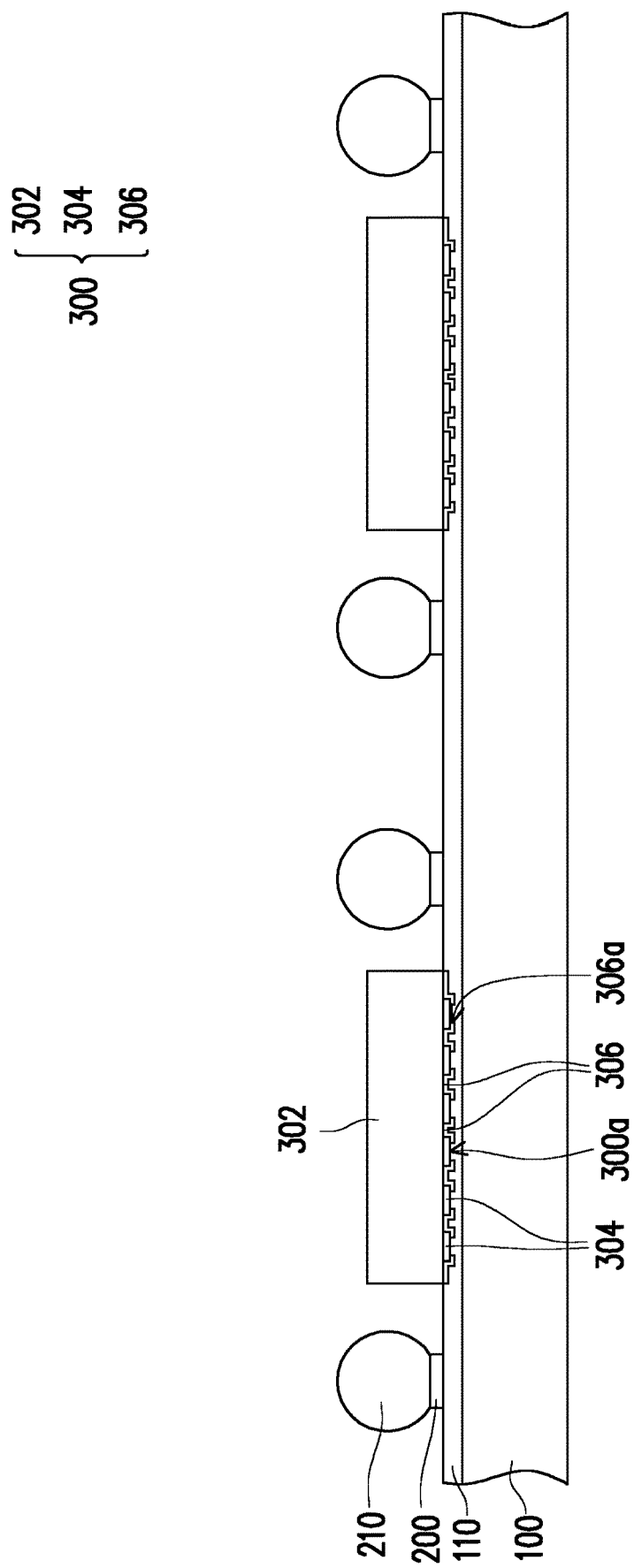

Referring to FIG. 1B, a plurality of dies 300 are placed on the first adhesive layer 110 along with the conductive balls 210. For example, the dies 300 may be placed such that each die 300 is surrounded by multiple conductive sheets 200 and multiple conductive balls 210. In other words, multiple conductive sheets 200 and multiple conductive balls 210 are disposed in a peripheral region around each die 300. The dies 300 are, for example, ASICs (Application-Specific Integrated Circuits). However, the disclosure is not limited thereto. The dies 300 may be other types of semiconductor devices. As illustrated in FIG. 1B, each die 300 includes a semiconductor substrate 302, a plurality of connection pads 304, and a passivation layer 306. In some embodiments, the semiconductor substrate 302 may be a silicon substrate including active components (e.g., transistors or the like) and optionally passive components (e.g., resistors, capacitors, inductors, or the like) formed therein. The connection pads 304 may be aluminium pads, copper pads, or other suitable metal pads. The connection pads 304 are disposed on an active surface 300a of the die 300. In some embodiments, the passivation layer 306 may be made of polymeric materials, a silicon oxide layer, a silicon nitride layer, a silicon oxy-nitride layer, or a dielectric layer formed by other suitable dielectric materials. The passivation layer 306 is disposed on the active surface 300a of the die 300 to cover the connection pads 304. The passivation layer 306 has a plurality of openings 306a revealing at least a portion of each connection pad 304 for future electrical connection. As illustrated in FIG. 1B, the dies 300 are disposed in a face down manner. The active surfaces 300a of the dies 300 may be directly in contact with the first adhesive layer 110. The connection pads 304 may be embedded within the first adhesive layer 110.

Figure 1C:
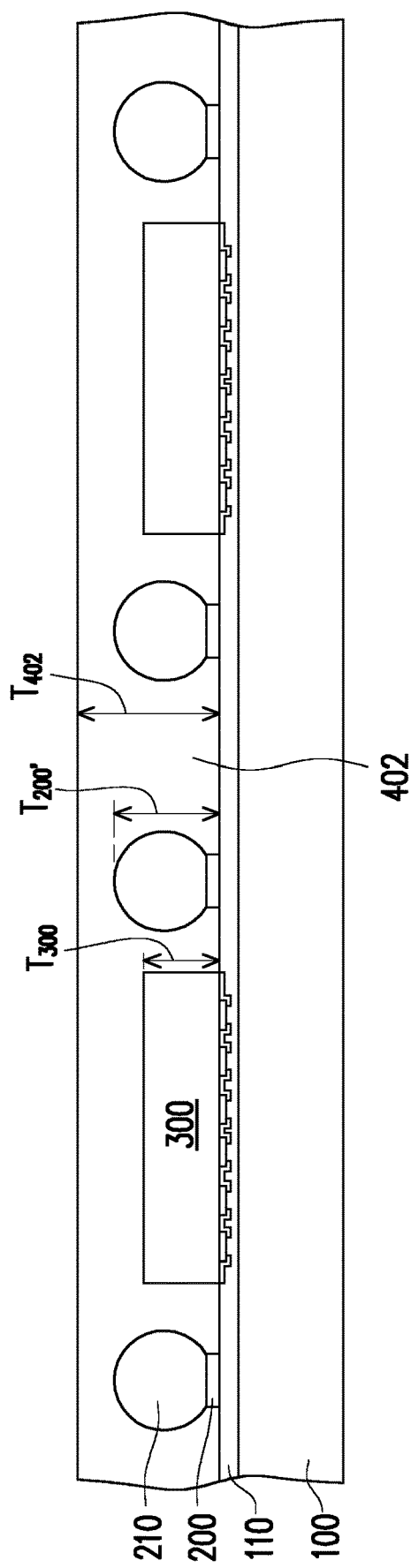

Referring to FIG. 1C, an encapsulation material 402 is formed over the first carrier 100 and the first adhesive layer 110 to fully cover the dies 300, the conductive sheets 200, and the conductive balls 210. The encapsulation material 402 may include a molding compound formed by a molding process or an insulating material such as epoxy, silicone, or other suitable resins. As illustrated in FIG. 1C, the encapsulation material 402 is formed by an over-molding process. A thickness $T_{402}$ of the encapsulation material 402 may be greater than a thickness $T_{300}$ of the die 300 and a total thickness $T_{200'}$ of the conductive sheet 200 and the conductive balls 210 to encapsulate the dies 300, the conductive balls 210 and the conductive sheets 200 with the encapsulation material 402.

Figure 1D:
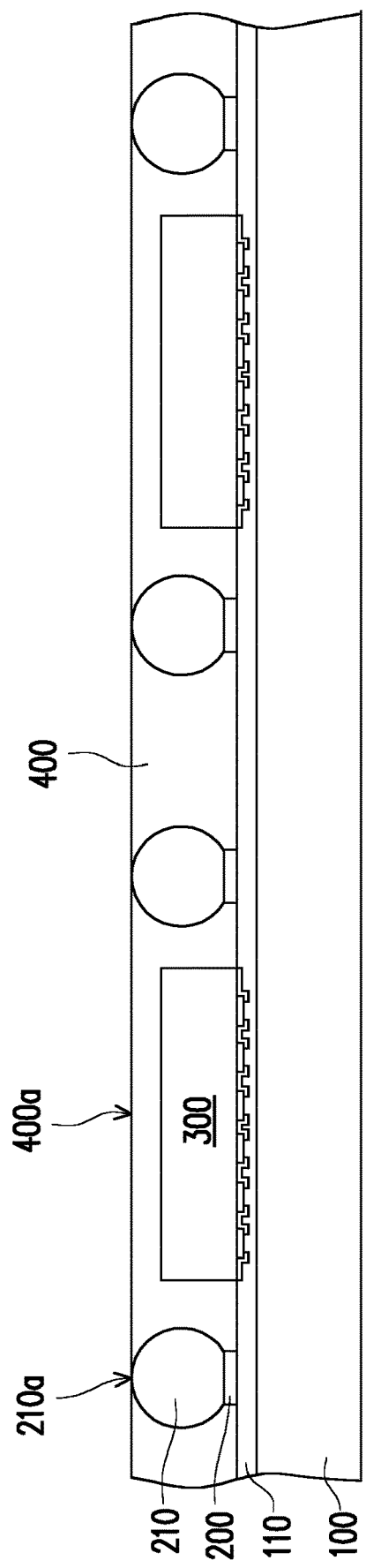

Referring to FIG. 1D, the thickness $T_{402}$ of the encapsulation material 402 is reduced until at least a portion of each conductive ball 210 is exposed to form a first encapsulant 400. The encapsulation material 402 may be planarized through a mechanical grinding process, a chemical mechanical polishing (CMP) process, or any other suitable processes. In some embodiments, a portion of each conductive ball 210 may be removed during the planarization process to render flat surfaces 210a. The first encapsulant 400 encapsulates the die 300, the conductive sheets 200, and the conductive balls 210. As illustrated in FIG. 1D, the exposed surfaces 210a of the conductive balls 210 are substantially coplanar with a first surface 400a of the first encapsulant 400. The exposed surfaces 210a of the conductive balls 210 may be available for electrical connection with other components subsequently formed.

Figure 1E:
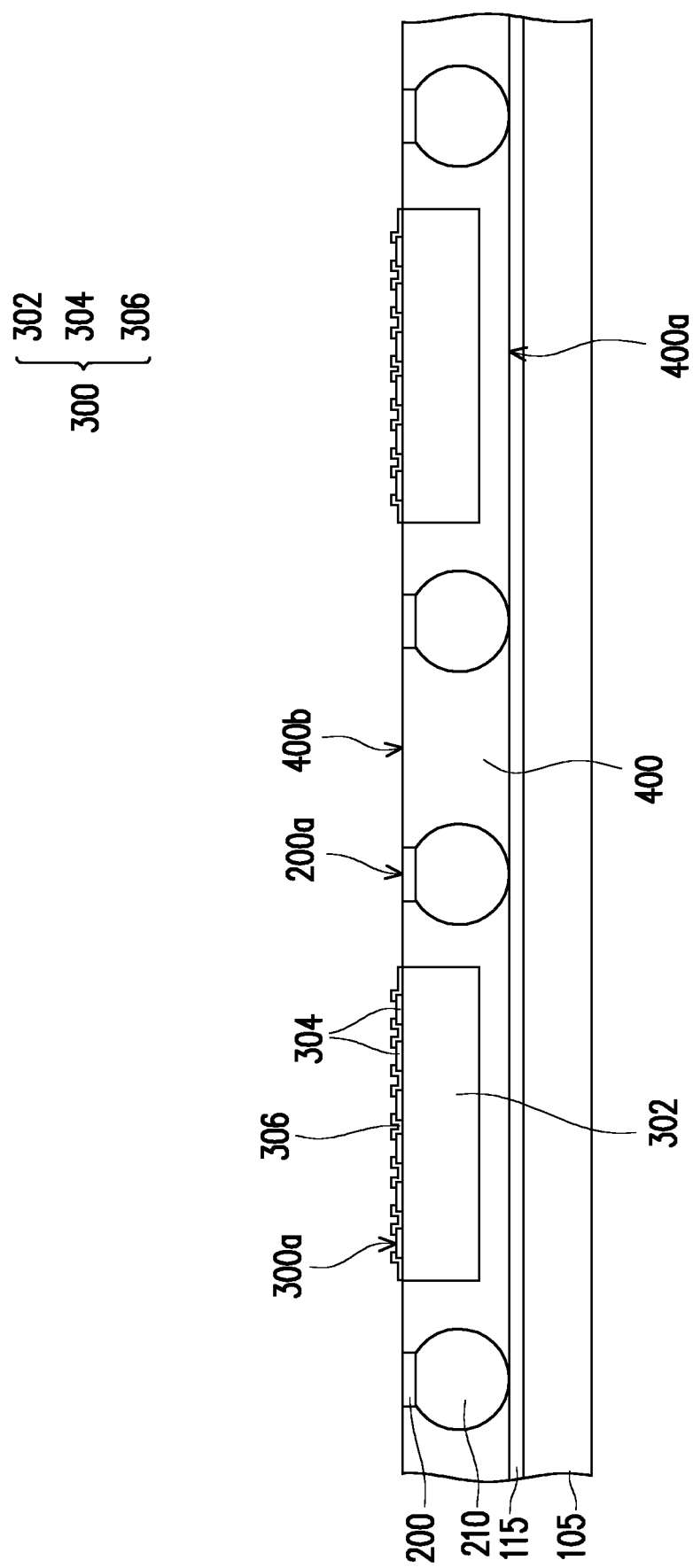

Referring to FIG. 1E, the first surface 400a of the first encapsulant 400 and the surfaces 210a of the conductive balls 210 may be attached to a second carrier 105 through a second adhesive layer 115. The second carrier 105 and the second adhesive layer 115 may be respectively made of the same material as that of the first carrier 100 and the first adhesive layer 110, so the detailed descriptions thereof are omitted herein. After the second carrier 105 and the second adhesive layer 115 are bonded to the first encapsulant 400 and the conductive balls 210, the first carrier 100 and the first adhesive layer 110 are removed. The first adhesive layer 110 and the first carrier 100 may be separated from the dies 300, the conductive sheets 200, and the first encapsulant 400 to expose a second surface 400b of the first encapsulant 400 opposite to the first surface 400a. After bonding to the second carrier 105, the connection pads 304 of the dies 300 and the conductive sheets 200 are exposed.

Figure 1F:
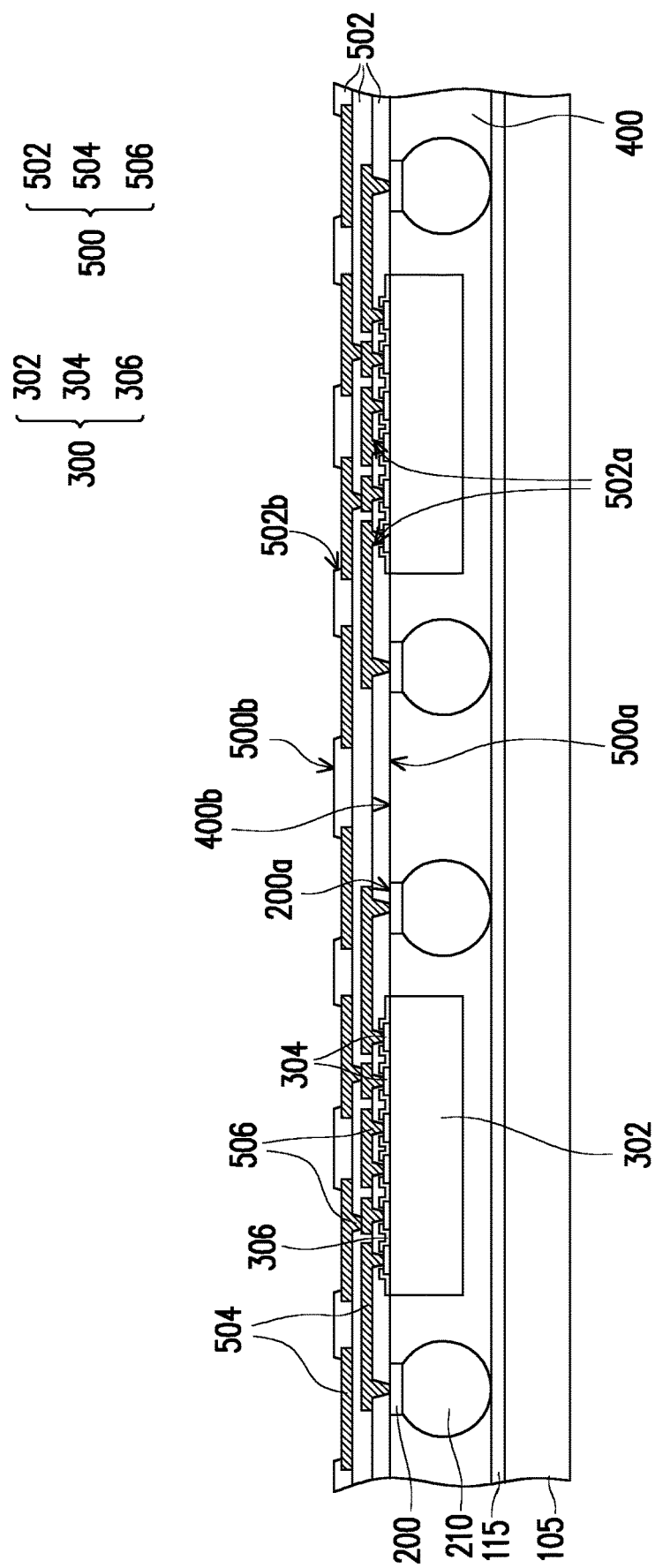

Referring to FIG. 1F, a first redistribution structure 500 is formed over the dies 300, the conductive sheets 200, and the first encapsulant 400. The first redistribution structure 500 has a first surface 500a and a second surface 500b opposite to the first surface 500a. The first surface 500a of the first redistribution structure 500 is physically coupled to the conductive sheets 200, the dies 300, and the first encapsulant 400. The first surface 500a of the first redistribution structure 500 is electrically connected to the connection pads 304 of the dies 300 and the conductive sheets 200. In some embodiments, each of the conductive sheets 200 is sandwiched between the first redistribution structure 500 and the corresponding conductive ball 210 to electrically couple the conductive balls 210 to the first surface 500a of the first redistribution structure 500. The first redistribution structure 500 may include at least one dielectric layer 502, a plurality of conductive patterns 504, and a plurality of conductive vias 506. The dielectric layers 502 may be formed by suitable fabrication techniques such as spin-on coating, chemical vapor deposition (CVD), plasma-enhanced chemical vapor deposition (PECVD), or the like. The conductive patterns 504 and the conductive vias 506 may be formed by sputtering, evaporation, electro-less plating, or electroplating. The dielectric layers 502 may be made of non-organic or organic dielectric materials such as silicon oxide, silicon nitride, silicon carbide, silicon oxynitride, polyimide, benzocyclobutene (BCB), or the like. The conductive patterns 504 and the conductive vias 506 are embedded in the dielectric layers 502. The dielectric layers 502 and the conductive patterns 504 may be stacked alternately. The conductive vias 506 may penetrate through the dielectric layers 502 to electrically connect the conductive patterns 504 to each other. The conductive patterns 504 and the conductive vias 506 may be made of copper, aluminum, nickel, gold, silver, tin, a combination thereof, a composite structure of copper/nickel/gold, or other suitable conductive materials.

As illustrated in FIG. 1F, the first redistribution structure 500 includes three dielectric layers 502. However, the number of the dielectric layers 502 is not limited and may be adjusted based on circuit design. The bottom dielectric layer 502 may have a plurality of contact openings 502a exposing the connection pads 304 of the dies 300 and the conductive sheets 200. The conductive vias 506 disposed in the contact openings 502a may be directly in contact with the connection pads 304 of the dies 300 and the conductive sheets 200. The middle dielectric layer 502 exposes part of the bottom conductive patterns 504 such that the bottom conductive patterns 504 may be electrically connected to other conductive patterns 504 through the conductive vias 506 to form electrical connections between the dies 300 and the conductive sheets 200. The top dielectric layer 502 has a plurality of contact openings 502b exposing a portion of the top conductive patterns 504 for electrical connection in the subsequent processes. In some embodiments, the top conductive patterns 504 may be referred to as under-bump metallization (UBM).

Figure 1G:
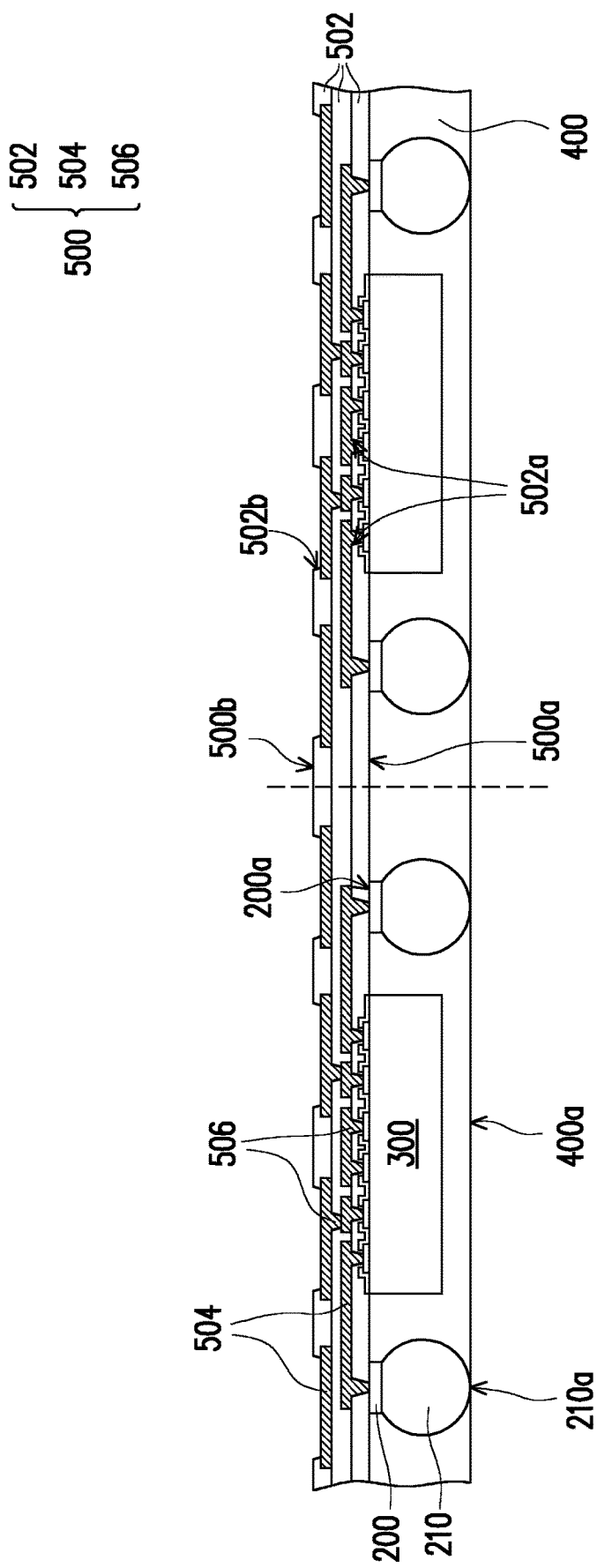
Figure 1H:
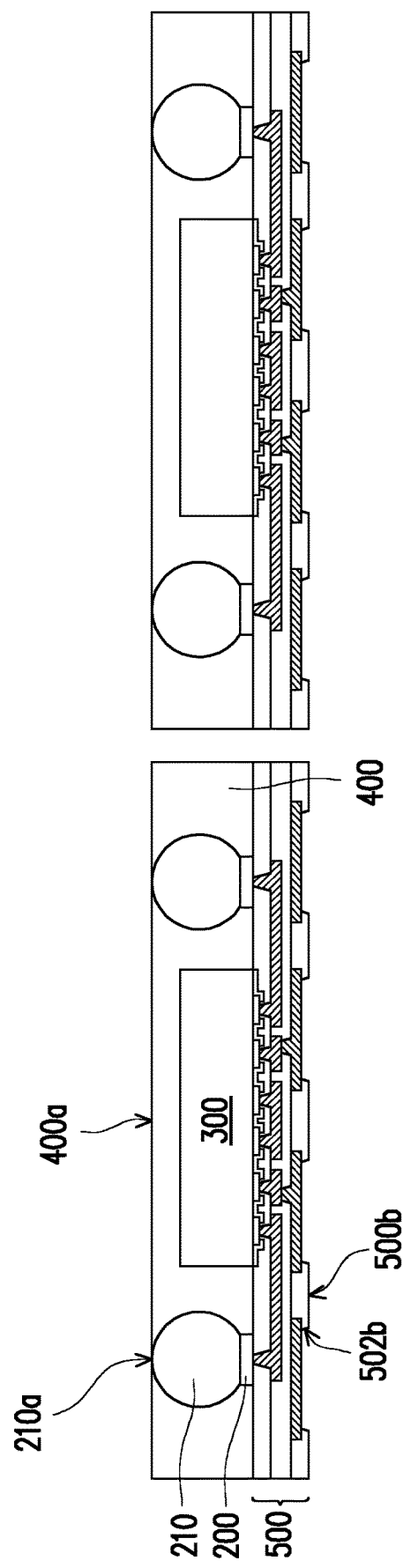

Referring to FIG. 1G, after the first redistribution structure 500 is formed, the second carrier 105 and the second adhesive layer 115 are removed to expose the first surface 400a of the encapsulant 400 and the surfaces 210a of the conductive balls 210. A dicing or singulation process is performed on the package structure array to form a plurality of intermediate package structures as shown in FIG. 1H. The singulation process includes cutting with rotating blades or laser beams. The package structure array may be sawed for wire-bonding, flip chip application, or Package-on-Package (PoP) purposes.

Figure 1I:
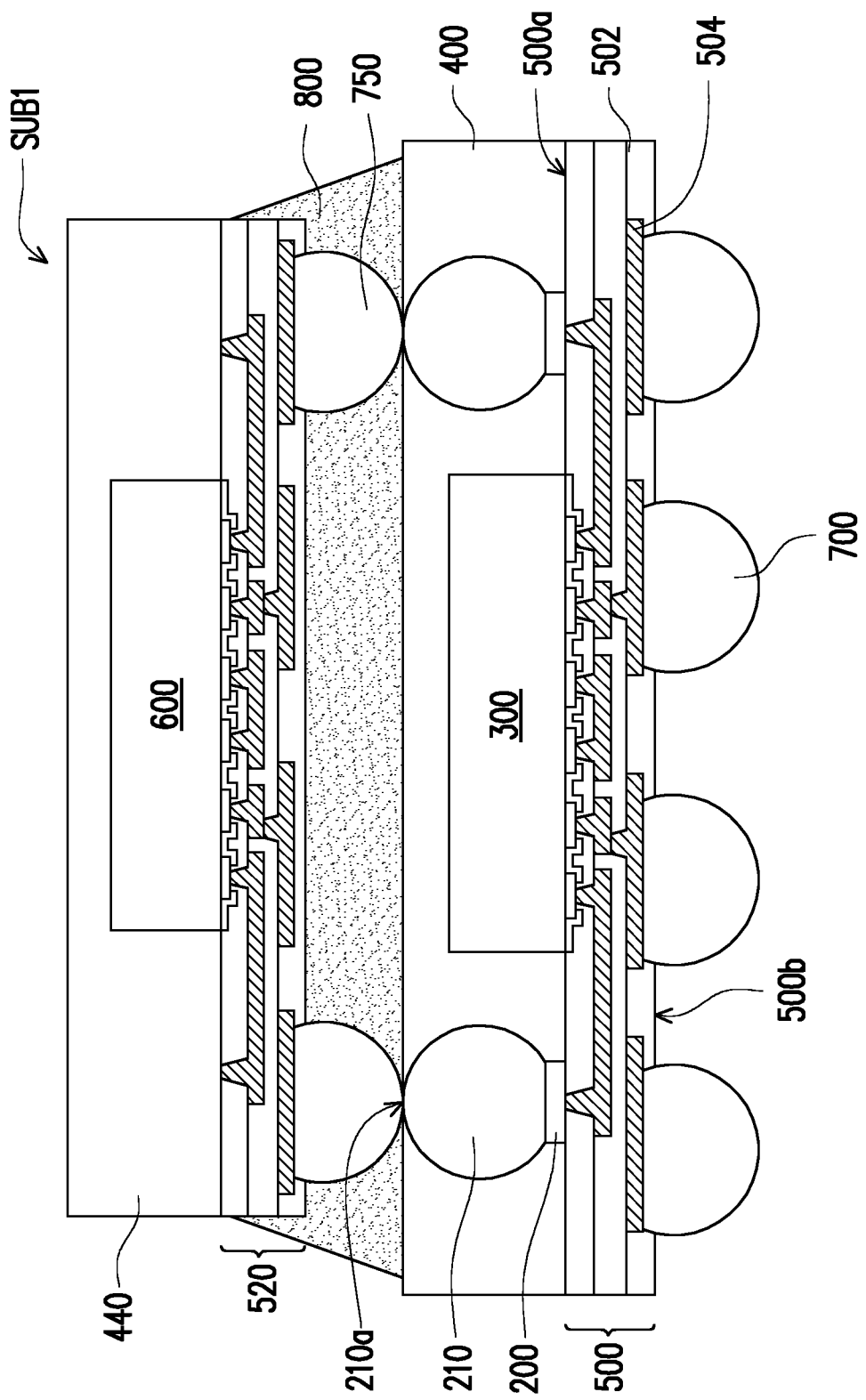

Referring to FIG. 1I, a plurality of conductive terminals 700 are formed over the second surface 500b of the first redistribution structure 500. The conductive terminals 700 may be formed by a ball placement process and a reflow process. The conductive terminals 700 may be conductive bumps such as solder balls. However, other possible forms and shapes of the conductive terminals 700 may be utilized. In some other embodiments, the conductive terminals 700 may be conductive pillars or conductive posts. In some embodiments, the conductive terminals 700 are correspondingly disposed on the top conductive patterns 504 exposed by the top dielectric layer 502. The conductive terminals 700 are electrically connected to the die 300 through the first redistribution structure 500.

After the conductive terminals 700 are formed over the first redistribution structure 500, a sub-package SUB1 may be stacked over the conductive balls 210 and the first encapsulant 400. The sub-package SUB1 may be a Ball Grid Array (BGA), a Flip Chip Scale Package (FCCSP), Flip Chip Ball Grid Array (FCBGA), Wafer Level Chip Scale Package (WLCSP), or passive devices. The sub-package SUB1 may include a chip 600, an encapsulant 440, a redistribution circuit 520, and a plurality of connection terminals 750. The chip 600 and the encapsulant 440 are disposed on the redistribution circuit 520. The encapsulant 440 encapsulates the chip 600. The connection terminals 750 are disposed on the redistribution circuit 520 The connection terminals 750 are electrically connected to the chip 600 through the redistribution circuit 520. Materials and formation methods of the encapsulant 440, the redistribution circuit 520, and the connection terminals 750 may be respectively similar to the first encapsulant 400, the first redistribution structure 500, and the conductive terminals 700. As illustrated in FIG. 1I, the connection terminals 750 of the sub-package SUB1 are in direct contact with the conductive balls 210. Although in FIG. 1I, the chip 600 is shown to be electrically connected to the redistribution circuit 520 in a face-down configuration, the disclosure is not limited thereto. In some alternative embodiments, the chip 600 may be placed on the redistribution circuit 520 through a die attaching film in a face-up configuration, and the electrical connection may be established through conductive wires (not shown).

An underfill 800 may be formed between the first encapsulant 400 and the redistribution circuit 520 to protect and isolate the coupling between the conductive balls 210 and the connection terminals 750. The underfill 800 may be formed by capillary underfill filling (CUF) and may include polymeric materials, resins, or silica additives.

The package structure 10 includes the first redistribution structure 500, the die 300, the conductive sheets 200, the conductive balls 210, the first encapsulant 400, the conductive terminals 700, and the sub-package SUB1. The die 300 and the conductive sheets 200 are disposed on the first surface 500a of the first redistribution structure 500. The conductive balls 210 are disposed on the corresponding conductive sheets 200. The first encapsulant 400 encapsulates the die 300, the conductive sheets 200, and the conductive balls 210. Vertical electrical connection within the package structure 10 may be provided by the conductive balls 210 and the conductive sheets 200 embedded in the first encapsulant 400. As such, dual-side stacking may be realized in the package structure 10. Since the conductive balls 210 and the conductive sheets 200 may be foil led using cost effective processes, the processing complexity and the manufacturing cost of the package structure 10 may be significantly reduced. Moreover, the conductive balls 210 and conductive sheets 200 may be pre-formed components. Thus, the conventional wet chemical processes for forming the vertical conductive structures may be eliminated. Due to lower chemical resistance concerns, higher flexibility in selecting the material for the die bonding adhesive may be achieved.

FIG. 2A to FIG. 2G are schematic cross-sectional views illustrating a manufacturing method of a package structure 20 according to some alternative embodiments of the disclosure. The structure illustrated in FIG. 2A may be obtained by performing the steps similar to the steps described in FIG. 1A to FIG. 1D, thus, detailed descriptions thereof are omitted.

Figure 2A:
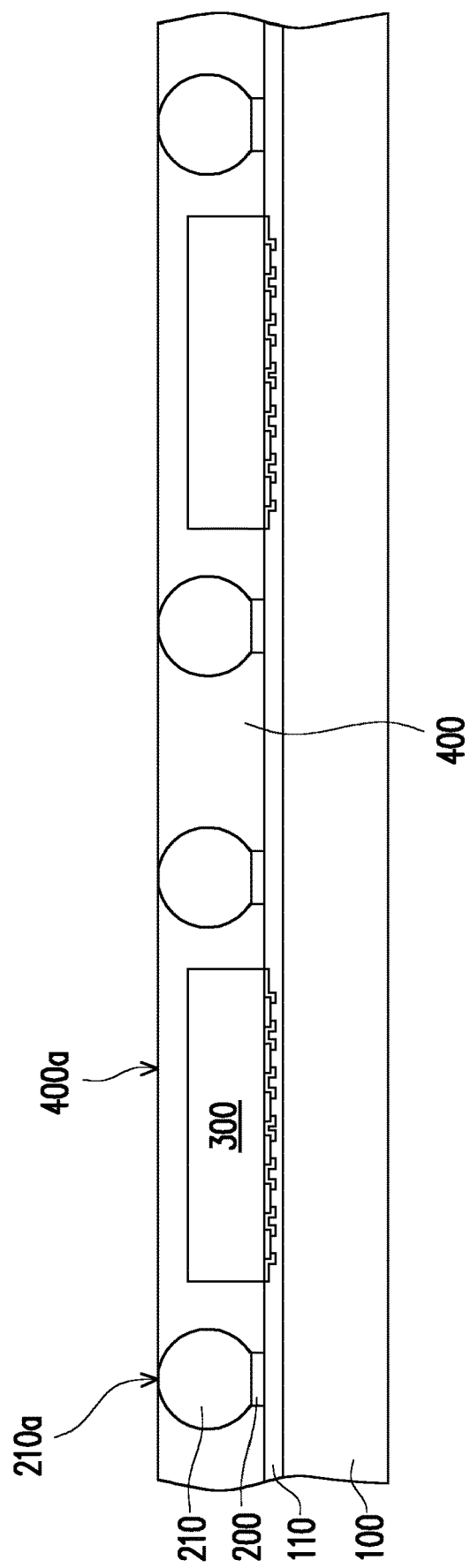
FIG. 2A to FIG. 2G are schematic cross-sectional views illustrating a manufacturing method of a package structure according to some alternative embodiments of the disclosure.
Figure 2B:
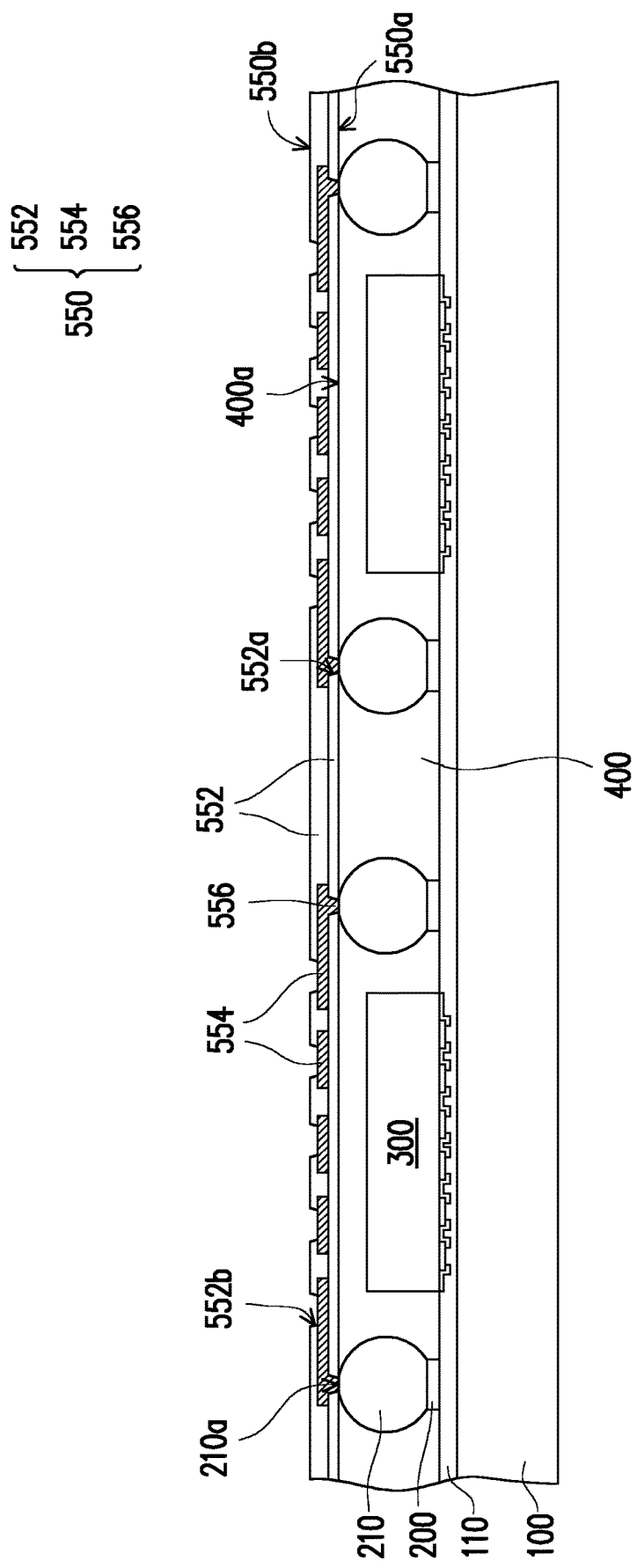

Referring to FIG. 2B, a second redistribution structure 550 is formed on the first encapsulant 400 and the conductive balls 210. The second redistribution structure 550 may be formed through processes and materials similar to that of the first redistribution structure 500. The second redistribution structure 550 has a first surface 550a and a second surface 550b opposite to the first surface 550a. The first surface 550a of the second redistribution structure 550 is attached to the conductive balls 210 and the first encapsulant 400. The second redistribution structure 550 may include at least one dielectric layer 552, a plurality of conductive patterns 554, and a plurality of conductive vias 556. The conductive patterns 554 and the conductive vias 556 are embedded in the dielectric layers 552. In some embodiments, the dielectric layers 552 and the conductive patterns 554 are stacked alternately. The conductive vias 556 penetrate through the dielectric layers 552 to electrically connect to the conductive patterns 554 or to electrically connect the conductive patterns 554 with other components.

The second redistribution structure 550 in FIG. 2B includes two dielectric layers 552. However, the number of the dielectric layers 552 may be adjusted based on circuit design. The bottom dielectric layer 552 may have a plurality of contact openings 552a exposing the conductive balls 210. The bottom conductive vias 556 disposed in the contact openings 552a may be directly in contact with the conductive balls 210 to form electrical connection between the conductive balls 210 and the second redistribution structure 550. The top dielectric layer 552 has a plurality of contact openings 552b exposing the conductive patterns 554 such that the conductive patterns 554 may be used for electrical connection in the subsequent processes. In some embodiments, the top conductive patterns 554 may be referred to as under-bump metallization (UBM).

Figure 2C:
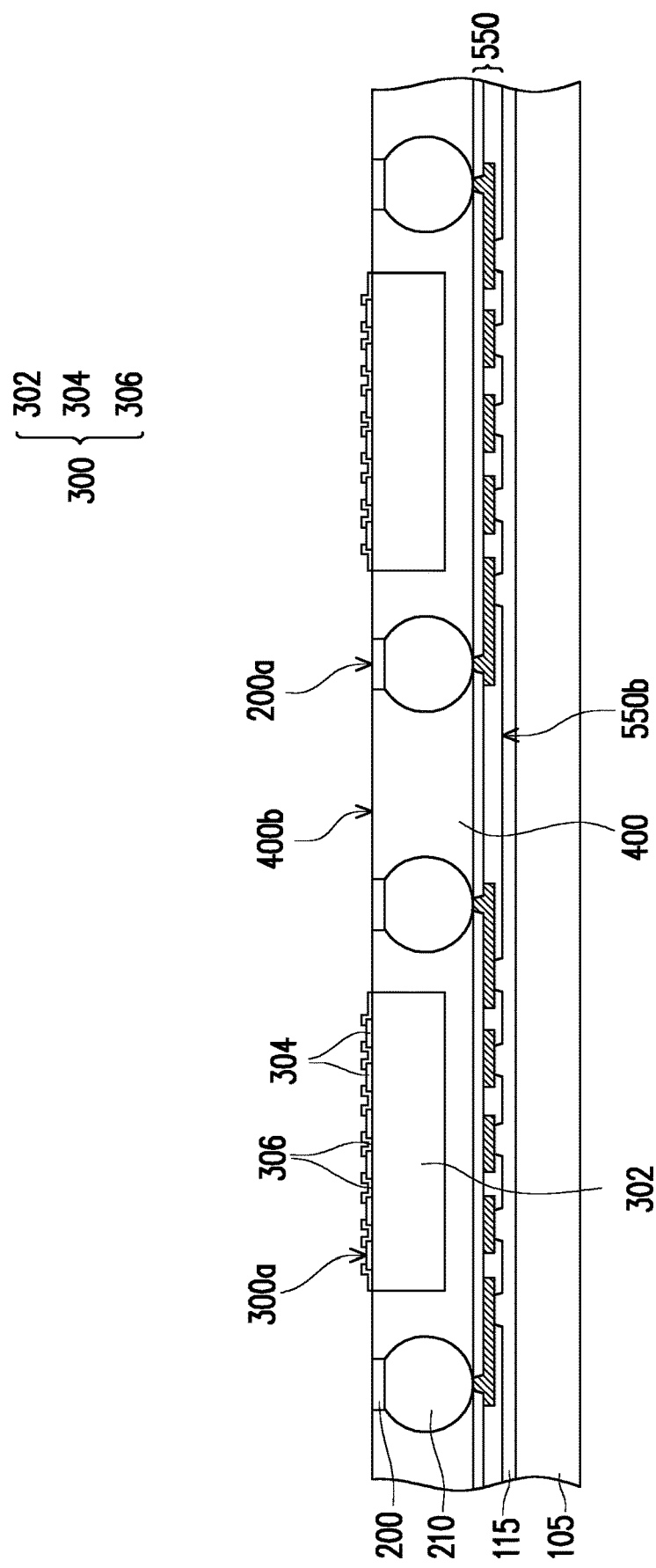

Referring to FIG. 2C, the second surface 550b of the second redistribution structure 550 may be attached to a second carrier 105 through a second adhesive layer 115 respectively similar to the second carrier 105 and the second adhesive layer 115 illustrated in FIG. 1E.

Figure 2D:
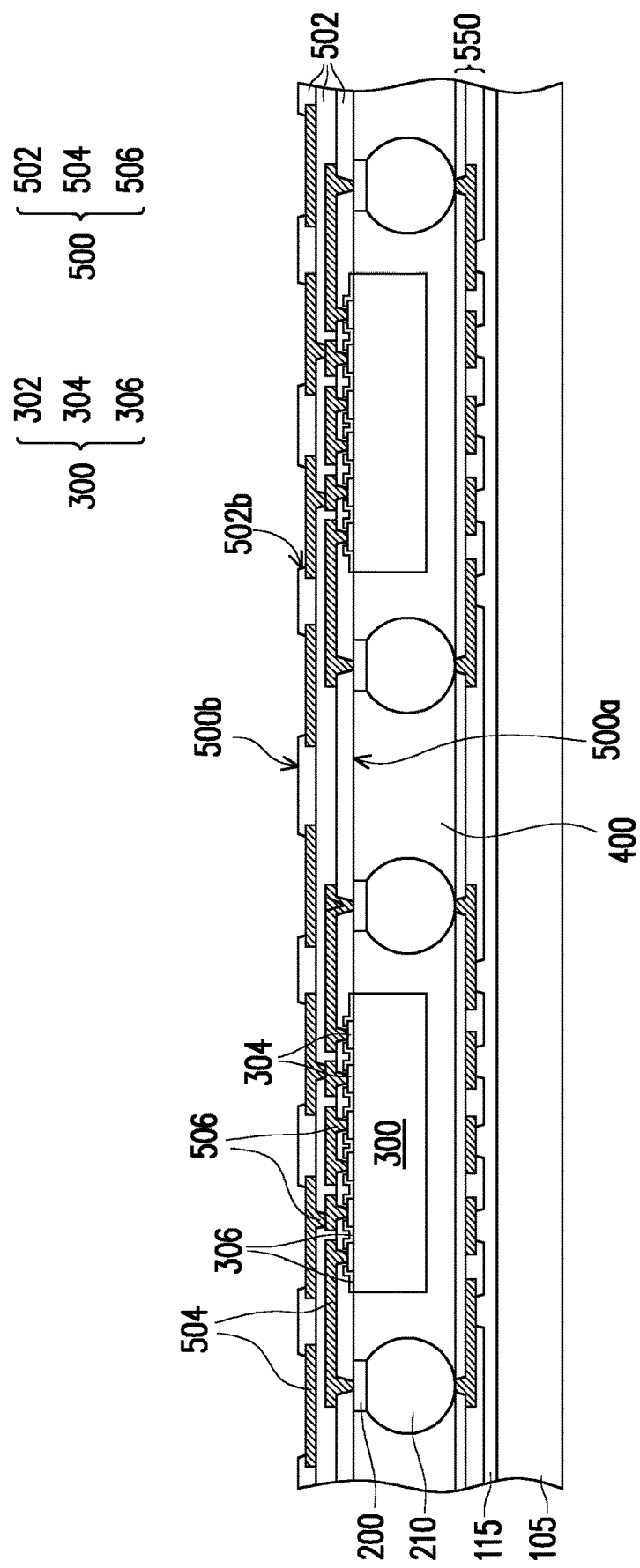
Figure 2E:
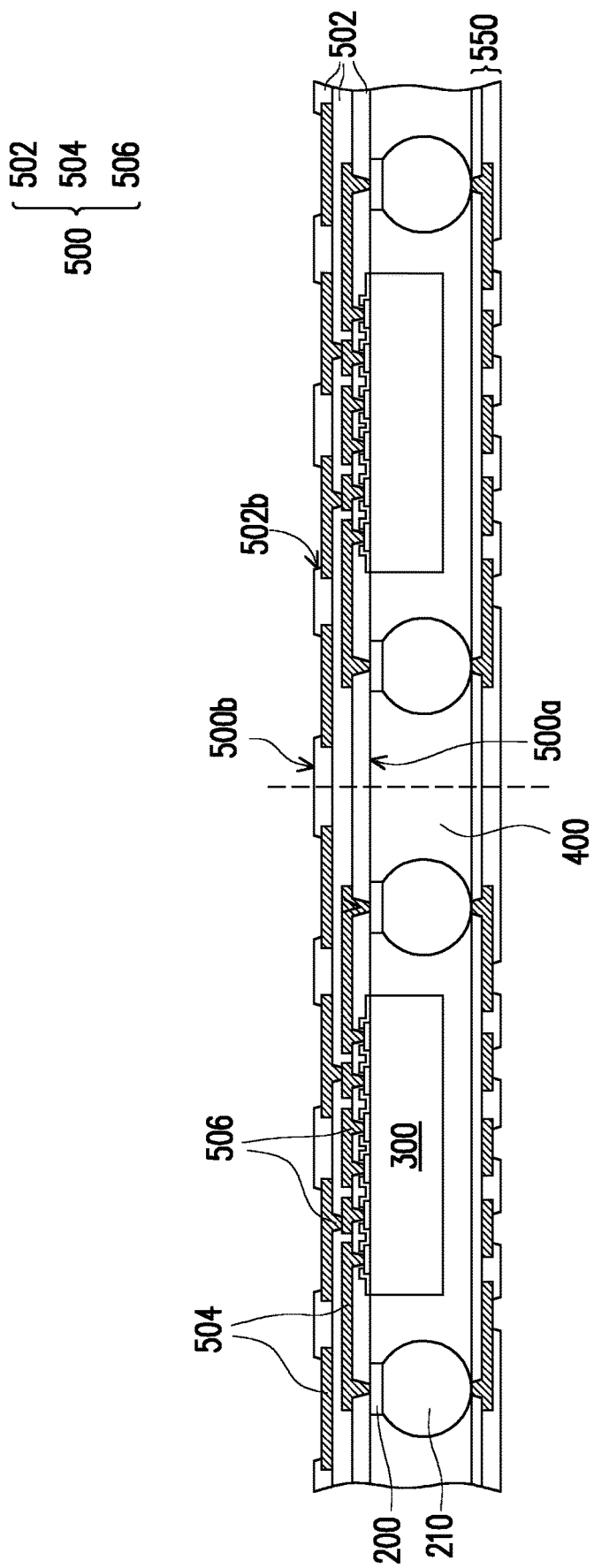
Figure 2F:
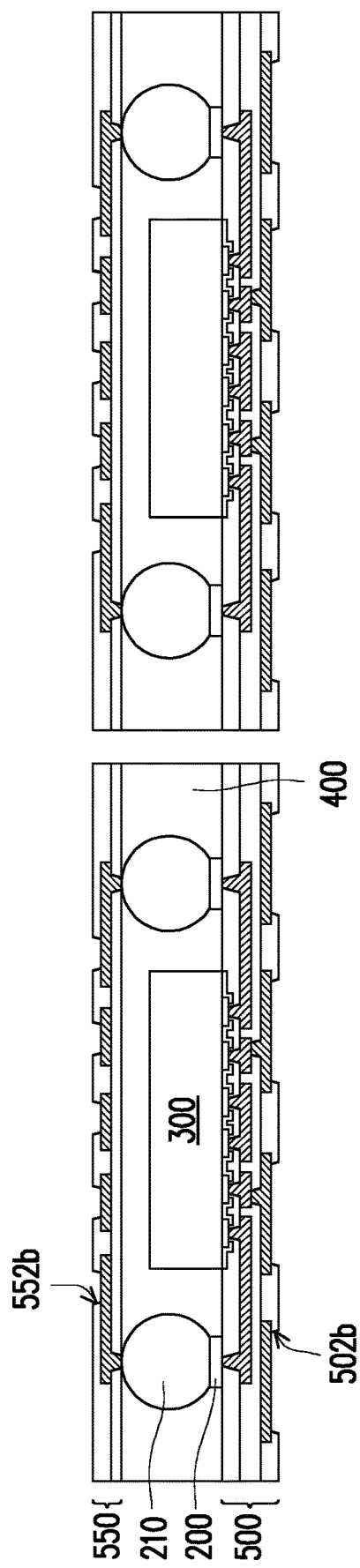

The steps illustrated in FIG. 2D to FIG. 2F may be similar to the steps described above in FIG. 1F to FIG. 1H, so the detailed descriptions thereof may be omitted.

Figure 2G:
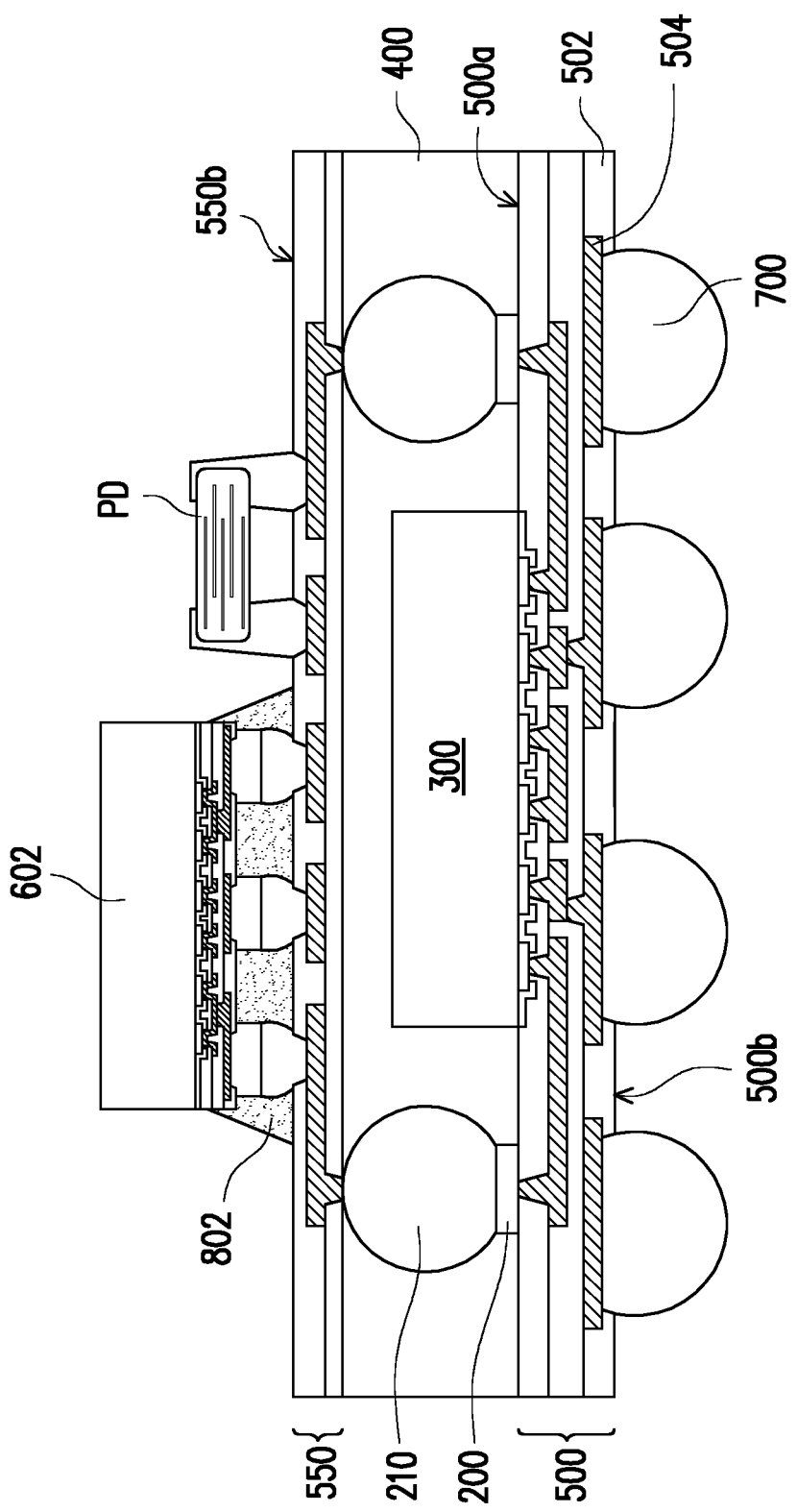

Referring to FIG. 2G, a plurality of conductive terminals 700 are formed on the second surface 500b of the first redistribution structure 500. The conductive terminals 700 herein are similar to the conductive terminals in FIG. 1I, so the detailed description thereof may be omitted. After the conductive terminals 700 are formed over the first redistribution structure 500, a chip 602 may be disposed on the second surface 550b of the second redistribution structure 550. The chip 602 may be electrically connected to the second redistribution structure 550 through flip-chip bonding.

An underfill 802 may be formed between the chip 602 and the second redistribution structure 550. The underfill 802 may be similar to the underfill 802 in FIG. 1I, so detailed description thereof may be omitted.

Furthermore, a passive device PD may be disposed on the second surface 550b of the second redistribution structure 550 to form a package structure 20. The passive device PD may be electrically connected to the second redistribution structure 550. The passive devices PD may be a capacitor, resistor, inductor, fuse, or antenna. Although only one chip 602 and only one passive device PD are illustrated in FIG. 2G, more than one chip 602 and more than one passive device PD may be disposed on the second redistribution structure 550.

The package structure 20 includes the first redistribution structure 500, the die 300, the conductive sheets 200, the conductive balls 210, the first encapsulant 400, the conductive terminals 700, the second redistribution structure 550, the chip 602, and the passive device PD. The die 300 and the conductive sheets 200 are disposed on the first surface 500a of the first redistribution structure 500. The conductive balls 210 are correspondingly disposed on the conductive sheets 200. The first encapsulant 400 encapsulates the die 300, the conductive sheets 200, and the conductive balls 210. The second redistribution structure 550 is disposed on the first encapsulant 400 opposite to the first redistribution structure 500. Vertical electrical connection within the package structure 20 is provided by the conductive balls 210 and the conductive sheets 200 to realize dual-side stacking for the package structure 20. The first redistribution structure 500 and the second redistribution structure 550 may be respectively formed on opposite sides of the first encapsulant 400 such that other components may be formed on either one of the first redistribution structure 500 or the second redistribution structure 550. Since the conductive balls 210 and the conductive sheets 200 may be formed using cost effective processes, the processing complexity and the manufacturing cost of the package structure 20 may be significantly reduced. Moreover, the conductive balls 210 and conductive sheets 200 may be pre-formed components. As such, the conventional wet chemical processes for forming the vertical conductive structures may be eliminated. Due to lower chemical resistance concerns, higher flexibility in selecting the material for the die bonding adhesive may be achieved.

Figure 3:
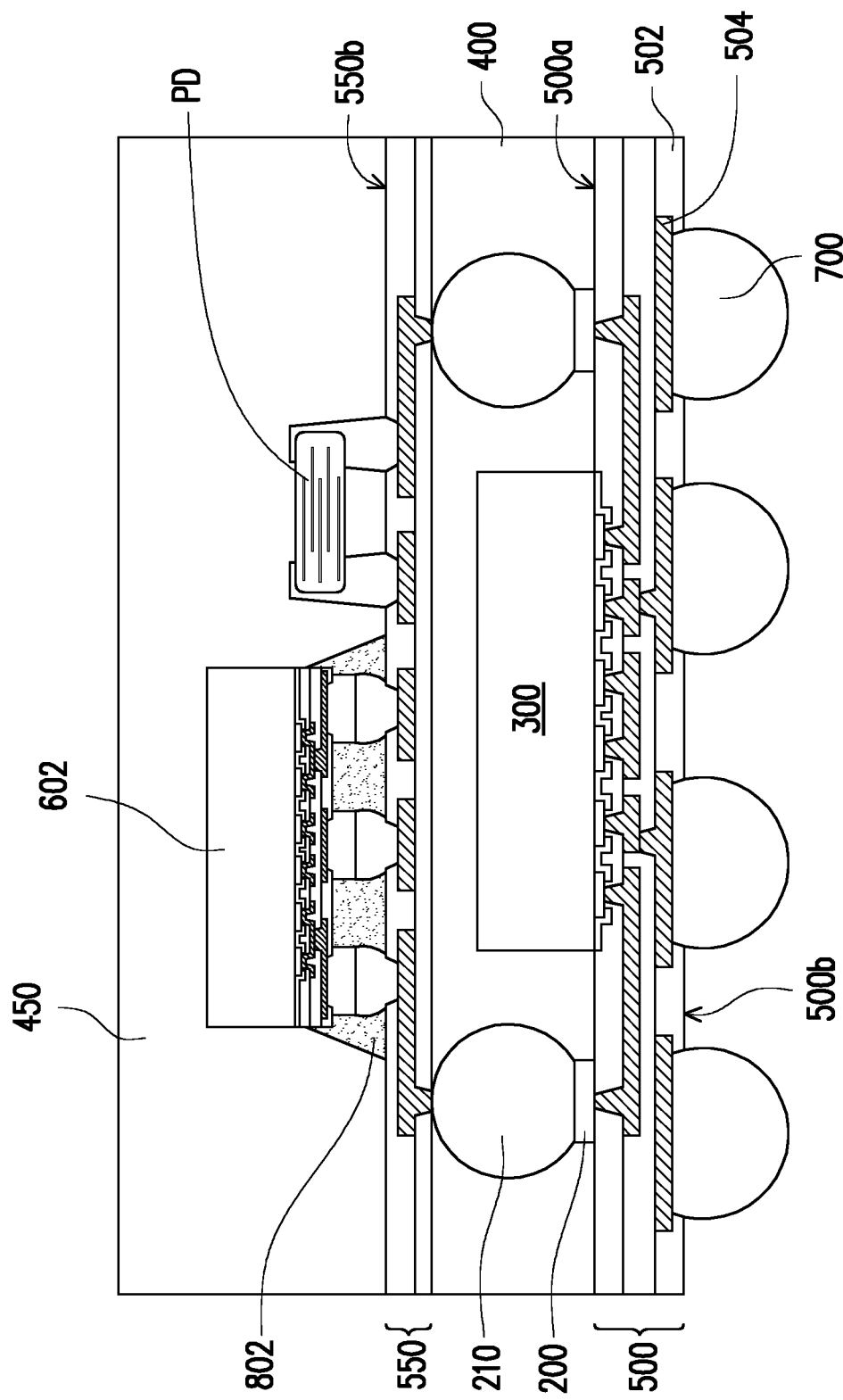
FIG. 3 is a schematic cross-sectional view illustrating a package structure according to some alternative embodiments of the disclosure.

FIG. 3 is a schematic cross-sectional view illustrating a package structure 30 according to some alternative embodiments of the disclosure. The package structure 30 is similar to the package structure 20 illustrated in FIG. 2G except a second encapsulant 450 is formed over the second redistribution structure 550 to encapsulate the chip 602 and the passive device PD. The second encapsulant 450 may be similar to the first encapsulant 400, so the detailed description thereof is omitted. The second encapsulant 450 may protect the chip 602 and the passive device PD from moisture or possible damages.

Figure 4:
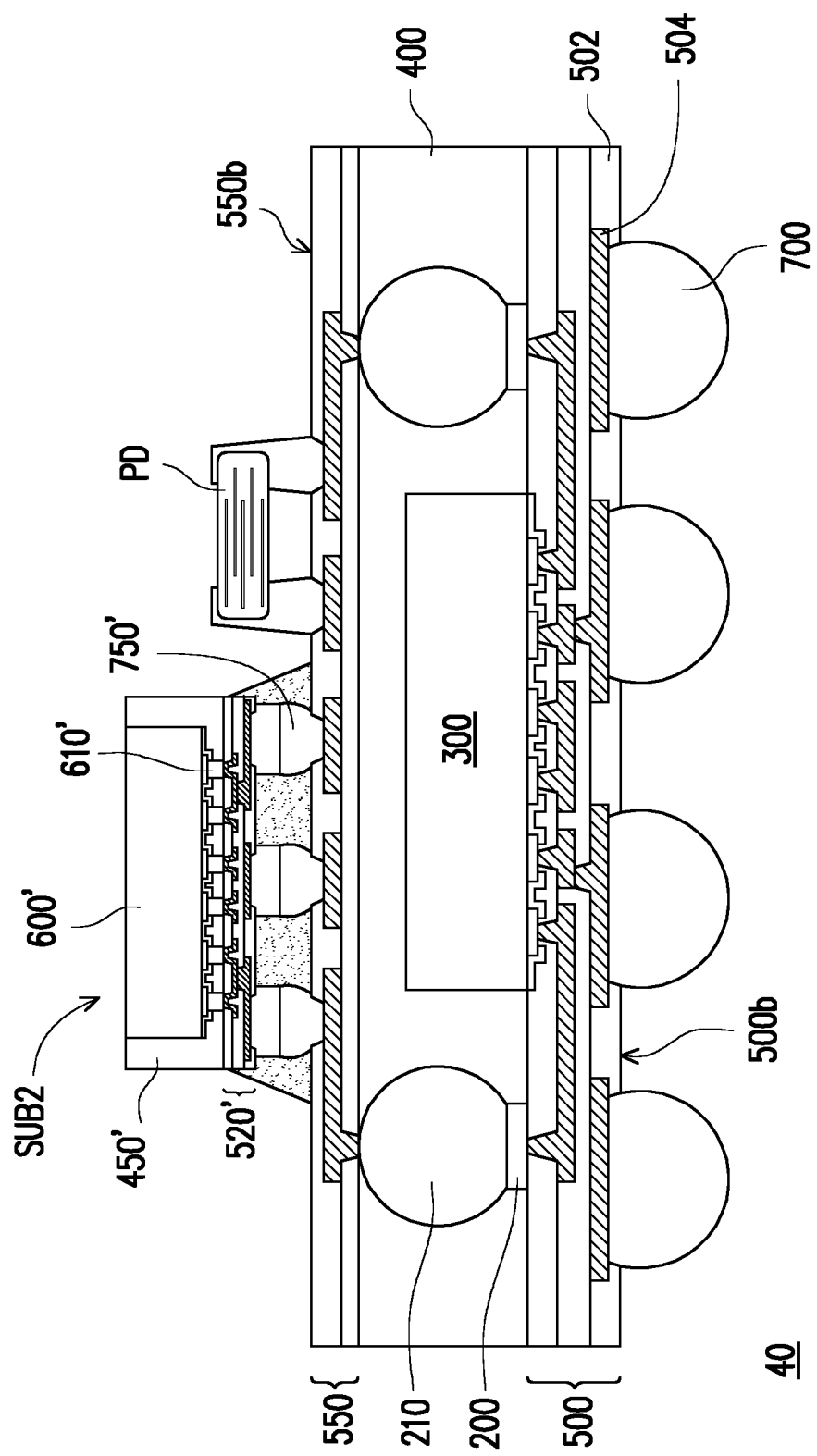
FIG. 4 is a schematic cross-sectional view illustrating a package structure according to some alternative embodiments of the disclosure.

FIG. 4 is a schematic cross-sectional view illustrating a package structure 40 according to some alternative embodiments of the disclosure. The package structure 40 is similar to the package structure 20 illustrated in FIG. 2G except a sub-package SUB2 instead of the chip 602 is placed over the second redistribution structure 550. The sub-package SUB2 may include a chip 600', an encapsulant 450', a redistribution circuit 520', a plurality of conductive pillars 610', and a plurality of connection terminals 750'. The chip 600' and the encapsulant 450' are disposed on the redistribution circuit 520' and the encapsulant 450' encapsulates the chip 600'. The chip 600' is electrically connected to the redistribution circuit 520' through the conductive pillars 610'. The conductive pillars 610' may be made of copper or any other suitable conductive materials. The connection terminals 750' are disposed on the redistribution circuit 520' opposite to the chip 600' and the encapsulant 450'. The connection terminals 750' are electrically connected to the chip 600' through the redistribution circuit 520'. Materials and formation methods of the encapsulant 450', the redistribution circuit 520', and the connection terminals 750' may be respectively similar to the first encapsulant 400, the first redistribution structure 500, and the conductive terminals 700, so the detailed descriptions thereof are omitted. The connection terminals 750' of the sub-package SUB2 are electrically connected to the second redistribution structure 550. Although only one sub-package SUB2 and only one passive device PD are illustrated in FIG. 4, more than one sub-packages SUB2 and more than one passive devices PD may be disposed on the second redistribution structure 550.

Vertical electrical connection within the package structure 40 may be provided by the conductive balls 210 and the conductive sheets 200 to realize dual-side stacking for the package structure 40.

Figure 5:
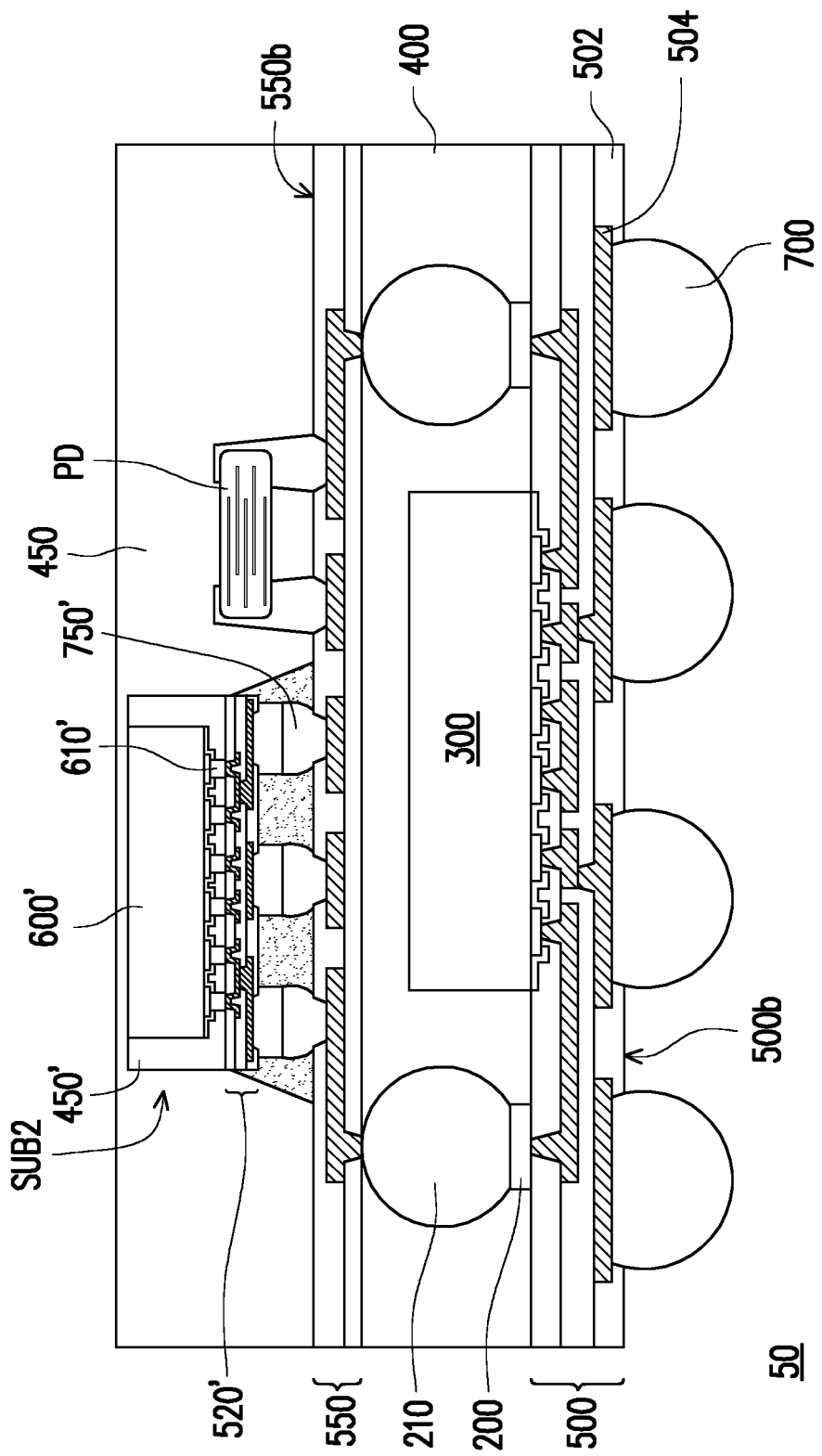
FIG. 5 is a schematic cross-sectional view illustrating a package structure according to some alternative embodiments of the disclosure.

FIG. 5 is a schematic cross-sectional view illustrating a package structure 50 according to some alternative embodiments of the disclosure. The package structure 50 is similar to the package structure 40 illustrated in FIG. 4 except a second encapsulant 450 is formed over the second redistribution structure 550 to encapsulate the sub-package SUB2 and the passive device PD. The second encapsulant 450 may be similar to the first encapsulant 400, so the detailed description thereof is omitted. The second encapsulant 450 may protect the sub-package SUB2 and the passive device PD from moisture or possible damages.

Figure 6:
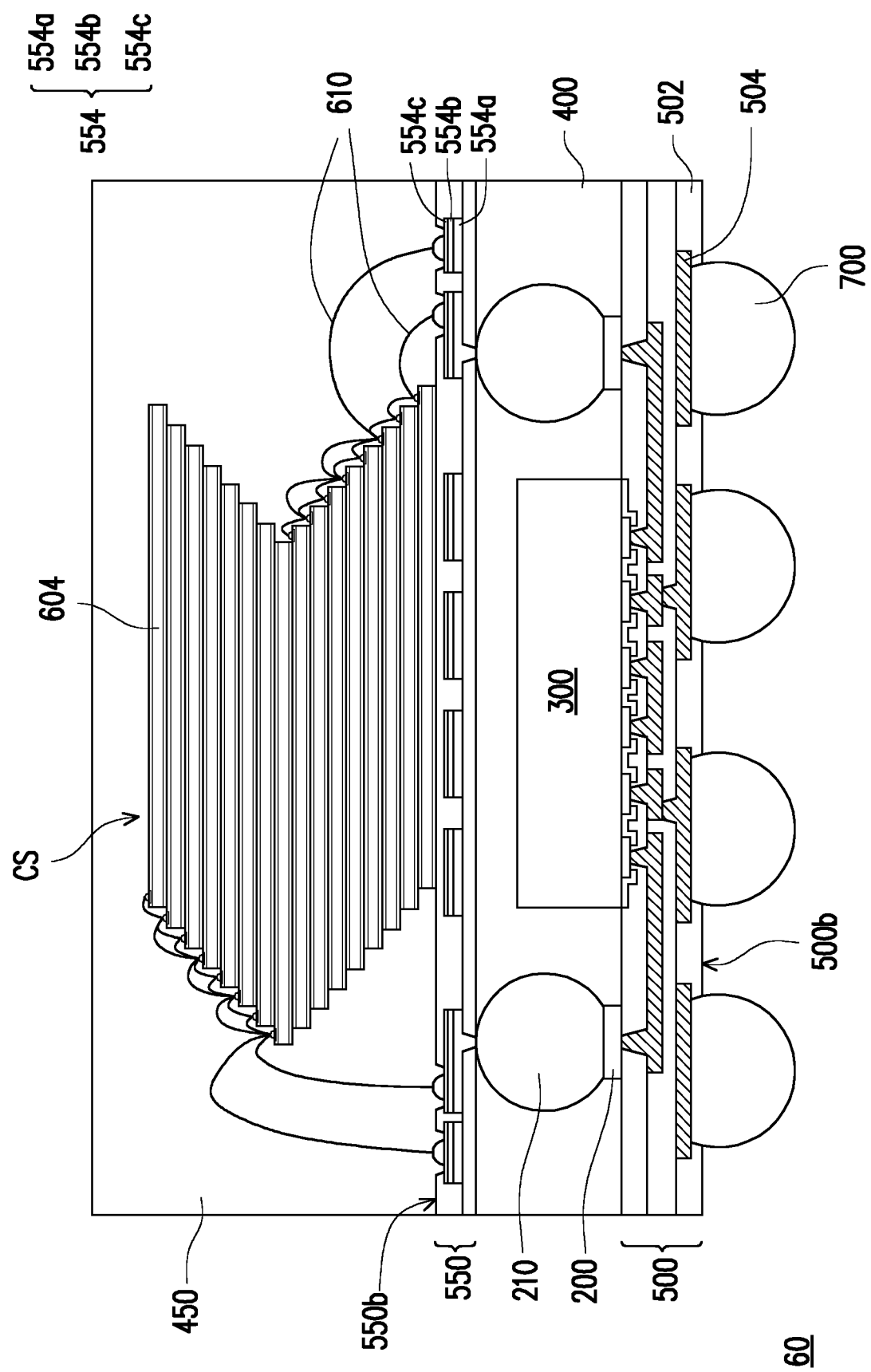
FIG. 6 is a schematic cross-sectional view illustrating a package structure according to some alternative embodiments of the disclosure.

FIG. 6 is a schematic cross-sectional view illustrating a package structure 60 according to some alternative embodiments of the disclosure. The package structure 60 is similar to the package structure 30 illustrated in FIG. 3 except a chip stack CS instead of the chip 602 and the passive device PD (illustrated in FIG. 3) is disposed over the second redistribution structure 550. In some embodiments, the chip stack CS may comprise a plurality of chips 604. A plurality of conductive wires 610 may be used to form the electrical connection between the chips 604 of the chip stack CS and the conductive patterns 554 of the second redistribution structure 550. The conductive wires 610 may be gold, copper, or any other suitable conductive materials. The conductive patterns 554 of the second redistribution structure 550 may be a multi-layered structure including a first layer 554a, a second layer 554b, and a third layer 554c. The first layer 554a, the second layer 554b, and the third layer 554c may be sequentially stacked on each other. In some embodiments, the first layer 554a may be a copper layer, the second layer 554b may be a nickel layer, and the third layer 554c may be a gold layer. However, the disclosure is not limited thereto. In some alternative embodiments, a different number of layers or layers of different materials may be used to form the conductive layer 554. The multi-layered structure of the conductive patterns 554 is configured to improve the bonding strength between the conductive patterns 554 and the conductive wires 610.

Based on the above, the package structure is formed with a fan-out design suitable for dual-side vertical integration. For example, vertical electrical connection within the package structure is provided by the conductive balls and the conductive sheets embedded in the first encapsulant. Since the conductive balls and the conductive sheets may be formed by rather simple and cheap processes, the processing complexity and the manufacturing cost of the package structure may be significantly reduced. Moreover, the adaption of conductive balls and the conductive sheets also eliminates the conventional wet chemical processes for forming the vertical conductive structures. Due to lower chemical resistance concerns, higher flexibility in selecting the material for the die bonding adhesive may be achieved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a package structure, comprising:
   providing a carrier having an adhesive layer thereon;
   forming a plurality of conductive sheets on the adhesive layer;
   forming a plurality of conductive balls on the plurality of conductive sheets;
   placing a plurality of dies on the adhesive layer, wherein each die has a plurality of connection pads, and the plurality of connection pads are embedded within the adhesive layer;
   forming a first encapsulant encapsulating the plurality of dies, the plurality of conductive sheets, and the plurality of conductive balls, wherein the first encapsulant exposes at least a portion of each conductive ball;
   separating the adhesive layer from the plurality of dies, the plurality of conductive sheets, and the first encapsulant; and
   forming a first redistribution structure over the plurality of dies, the plurality of conductive sheets, and the first encapsulant, wherein the first redistribution structure is electrically connected to the plurality of dies and the plurality of conductive sheets.

2. The method of claim 1, wherein the step of forming the plurality of conductive balls on the plurality of conductive sheets comprises:
   placing the plurality of conductive balls on the corresponding conductive sheets; and
   performing a reflow process to couple the plurality of conductive balls and the plurality of conductive sheets.

3. The method of claim 1, further comprising stacking a sub-package on the plurality of conductive balls and the first encapsulant, wherein the sub-package is electrically connected to and in direct contact with the plurality of conductive balls.

4. The method of claim 1, further comprising forming a second redistribution structure on the first encapsulant opposite to the first redistribution structure, wherein the second redistribution structure is electrically connected to the plurality of conductive balls.

5. The method of claim 4, further comprising disposing at least one chip, at least one sub-package, at least one passive device, or a combination thereof on the second redistribution structure, wherein the at least one chip, the at least one sub-package, the at least one passive device, or the combination thereof is electrically connected to the second redistribution structure.

6. The method of claim 5, further comprising encapsulating the at least one chip, the at least one sub-package, the at least one passive device, or the combination thereof by a second encapsulant.

7. The method of claim 1, further comprising forming a plurality of conductive terminals on the first redistribution structure.

8. The method of claim 1, wherein the step of forming the first encapsulant comprises:
   forming an encapsulation material to fully cover the plurality of dies, the plurality of conductive sheets, and the plurality of conductive balls; and
   reducing a thickness of the encapsulation material to form the first encapsulant.

\* \* \* \* \*